United States Patent [19]
Milora

[11] 4,357,069
[45] Nov. 2, 1982

[54] SOLDER-BEARING LEAD HAVING SOLDER-CONFINING STOP MEANS

[75] Inventor: Carmen J. Milora, Andover, Mass.

[73] Assignee: Western Electric Company, Inc., New York, N.Y.

[21] Appl. No.: 231,568

[22] Filed: Feb. 4, 1981

[51] Int. Cl.³ .............................................. H01R 11/06
[52] U.S. Cl. ................................. 339/275 R; 228/215
[58] Field of Search ............... 339/17 C, 17 L, 17 LC, 339/258 R, 258 P, 275 R, 275 B, 275 T; 228/118, 215

[56] References Cited

U.S. PATENT DOCUMENTS

| | | | |
|---|---|---|---|
| 3,249,910 | 5/1966 | Venn et al. | 339/275 B |
| 3,351,704 | 11/1967 | Sitzler | 174/84 |
| 3,750,252 | 8/1973 | Landman | 29/191.6 |
| 3,827,918 | 8/1974 | Ameen et al. | 117/6.2 |
| 3,864,004 | 2/1975 | Friend | 339/275 B |
| 4,019,803 | 4/1977 | Schell | 339/275 B |
| 4,034,471 | 7/1977 | Bias | 29/629 |
| 4,085,998 | 4/1978 | Owens | 339/275 B |
| 4,120,558 | 10/1978 | Seidler | 339/275 T |
| 4,203,648 | 5/1980 | Seidler | 339/275 T |

*Primary Examiner*—Joseph H. McGlynn
*Attorney, Agent, or Firm*—D. D. Bosben

[57] ABSTRACT

A solder-bearing lead (10 or 10') is provided with solder-confining stops (20 and 22 or 20' and 22') to preclude detrimental flow of molten solder from a solder preform (12 or 12') on a contact finger (26 or 26') of the lead, along a stem (18 or 18') of the lead in a soldering operation. Accordingly, substantially all of the molten solder flows across the thickness of the contact (26 or 26') to a contact pad (14 or 14') and is confined on the contact pad to form a solder connection (44 or 44'). The solder-confining stops (20 and 22 or 20' and 22') are formed by oxidized portions of a base metal (phosphor bronze) from which portions of solder-wettable (tin) coatings (36 and 38 or 36' and 38') have been removed.

4 Claims, 6 Drawing Figures

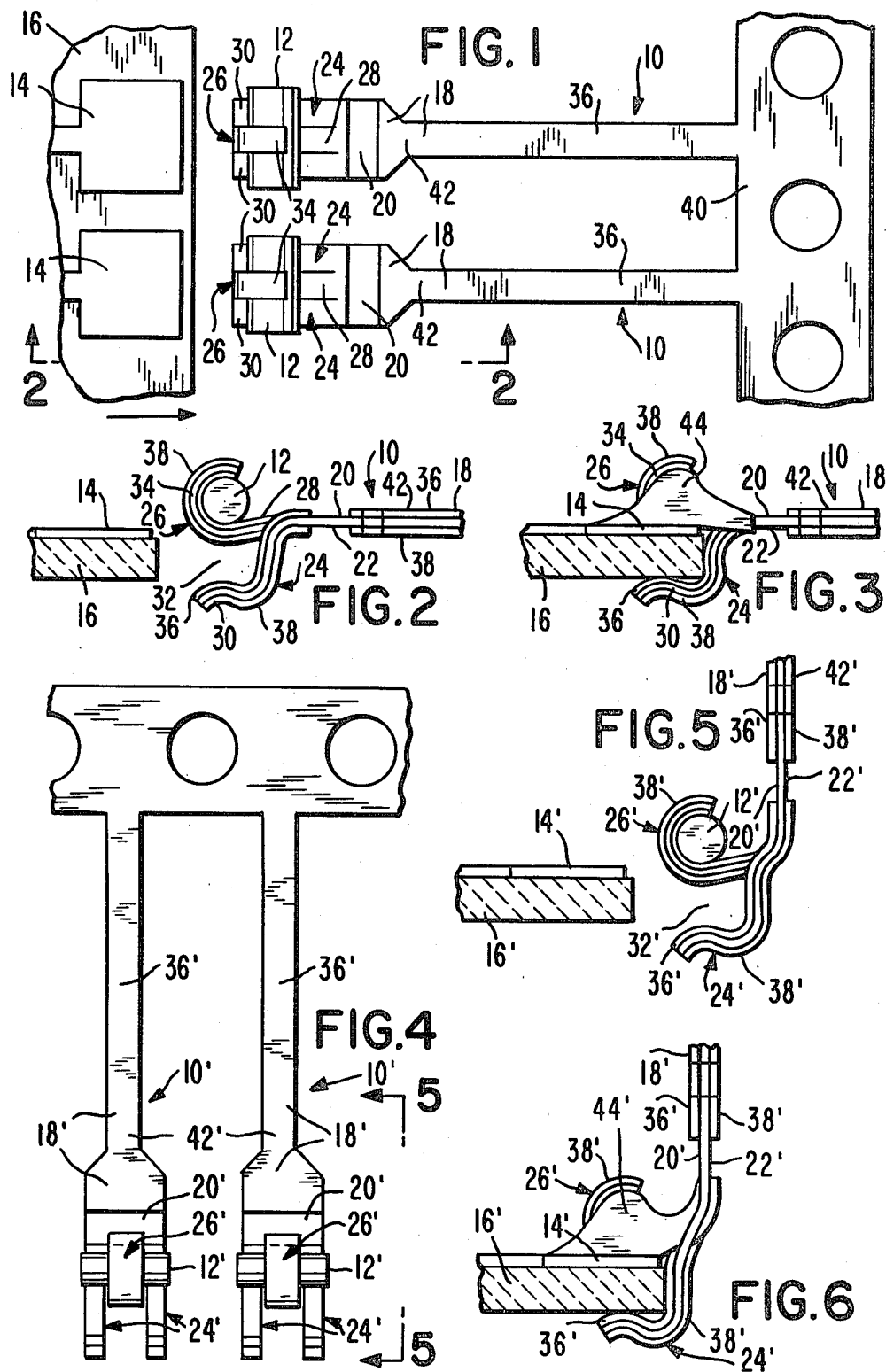

SOLDER-BEARING LEAD HAVING SOLDER-CONFINING STOP MEANS

TECHNICAL FIELD

This invention relates to a solder-bearing lead having solder-confining stop means, and more particularly to a solder-bearing lead having solder-confining stops formed on opposite sides of a lead stem to preclude flow of molten solder from a solder preform along the stem.

BACKGROUND OF THE INVENTION

A solder-bearing lead is known in which the lead includes opposed resilient clamping fingers at one end of an elongated stem, with at least one of the fingers defining an electrical contact. The clamping fingers include opposed inner surfaces which define a gap for the reception of a rigid substrate circuit device therebetween, such that the inner surface on the electrical contact clamping finger engages a contact pad on the substrate circuit device. On an outer opposite surface of the contact clamping finger, the contact clamping finger carries a solder preform. The solder preform, upon being temporarily subjected to heat in a soldering operation, initially melts and flows over opposite sides of the contact finger onto the contact pad, and then resolidifies to bond the lead to the contact pad. Solder-bearing leads of this type are shown in the U.S. Pat. No. 4,019,803 to M. S. Schell, and the U.S. Pat. Nos. 4,120,558 and 4,203,648 to J. Seidler.

Solder-bearing leads as above described normally are fabricated in strip form in a progressive punch-and-die from a strip of phosphor bronze base metal which has been provided with thin tin coatings on opposite sides thereof, to facilitate the subsequent making of electrical connections to the leads. During the lead fabrication process in the progressive punch-and-die, a continuous solder wire is attached to the contact fingers of the leads and subsequently clipped between the leads to form the solder preforms on the leads. Further, during the lead fabrication process the stems of the leads are formed integrally connected to an elongated continuous support rail which subsequently is clipped from the stems after the leads have been mounted on a substrate circuit device and soldered to respective contact pads on the device.

In fabricating the solder-bearing leads from a tin-coated phosphor bronze strip as above-described, while portions of one of the tin coatings are wiped across a portion of the thickness of the base metal so as to coat the base metal, a major portion of the base metal thickness usually is not coated in this manner and is exposed to the atmosphere. When each lead then is mounted on a substrate circuit device the portion of the solder preform held by the contact finger of the lead is separated from the contact pad with which the contact finger is engaged, by phosphor bronze base metal which, as a result of oxidation from exposure to the atmosphere, is not readily wetted by solder. Accordingly, where the lead stem is horizontally disposed, instead of flowing down onto the contact pad in a soldering operation, the solder from the melted preform normally flows along the solder-wettable tin coating of the lead on the lead stem in a "wicking" action. Similarly, molten solder which does flow down to the contact pad then flows along the solder-wettable tin coating on the opposite side of the lead stem in a "wicking" action. Either flow is undesirable because the solder contaminates the tin coatings on the lead stem and because sufficient solder then may not be available on the contact pad to form a satisfactory soldered connection between the contact pad and the lead.

The flow of the molten solder along a stem of the lead tends to occur even when the stem is disposed in a vertical position during the soldering operation, with the melted solder from the preform flowing up opposite sides of the stem in a "wicking" action. While the molten solder then usually flows back down the stem onto the contact pad, the reverse flow of the solder has the further disadvantage of causing detrimental melting and thinning out of the tin coatings on the stem. Further, in certain instances where the solder resolidifies on the stem, sufficient solder may not be available on the contact pad, as noted above, to form a satisfactory soldered connection between the contact pad and the lead.

Accordingly, a primary purpose of this invention is to provide a new and improved solder-bearing lead having solder-confining stops on a stem of the lead to preclude detrimental flow of molten solder from a solder preform along the stem.

SUMMARY OF THE INVENTION

In general, a solder-bearing lead comprises an elongated stem and first and second resilient clamping fingers extending in opposed spaced relationship from the elongated stem to define a gap for the reception of a substrate therebetween. At least one of the clamping fingers defines an electrical contact having an inner surface for engaging a contact pad on the substrate. A solder mass is attached to an outer opposite surface of the electrical contact finger, and a solder-confining stop is formed on the stem of the lead for precluding flow of the solder from the solder mass along the stem during a soldering operation.

More specifically, the lead stem and the resilient clamping fingers are formed from a base metal which is coated on first and second opposite sides thereof with a metal which is readily wetted by solder. The first solder-confining stop and a second solder-confining stop are formed on opposite sides of the lead stem by oxidized portions of the base metal from which portions of the solder-wettable coatings have been removed. The second solder-confining stop precludes flow of the molten solder along the stem of the lead from the substrate contact pad during the soldering operation.

BRIEF DESCRIPTION OF THE DRAWINGS

FIG. 1 is a plan view of one embodiment of a portion of a strip of solder-bearing leads in accordance with the invention;

FIG. 2 is a partial side view of a solder-bearing lead in accordance with the invention, looking in the direction of the arrows 2—2 in FIG. 1;

FIG. 3 is a view similar to FIG. 2, showing the solder-bearing lead thereof after the lead has been assembled and soldered to a substrate circuit device;

FIG. 4 is an elevational view of another embodiment of a portion of a strip of solder-bearing leads in accordance with the invention;

FIG. 5 is a partial side view of a solder-bearing lead in accordance with the invention, looking in the direction of the arrows 5—5 in FIG. 4; and FIG. 6 is a view similar to FIG. 4, showing the solder-bearing lead thereof after the lead has been assembled and soldered to a substrate circuit device.

DETAILED DESCRIPTION

Referring to FIGS. 1, 2 and 3, the embodiment of the invention as disclosed in these figures is directed to a solder-bearing lead 10 of a type wherein each lead carries a mechanically clamped solder mass or preform 12 (FIGS. 1 and 2) for bonding the lead to a respective contact pad 14 on a rigid substrate circuit device 16. In accordance with this invention, a stem 18 of each lead 10 includes solder-confining stops 20 and 22 which preclude the flow of solder from the melted preform along the stem of the lead during a soldering operation.

Each solder-bearing lead 10 may include a set of three resilient spring clamping fingers, consisting of two outer fingers 24 and a central contact finger 26, projecting from an enlarged end portion of the lead stem 18. The central contact finger 26 includes a first portion 28 which forms an extension of the stem 18 essentially in the plane thereof and which is spaced from essentially opposed parallel portions 30 of the two outer fingers 24. The opposed spring finger portions 28 and 30 define a gap 32 (FIG. 2) in which the substrate circuit device 16 is receivable with a slight force-fit for mounting the lead 10 on the substrate circuit device with a planar inner surface of the central contact finger 26 in firm engagement with a respective one of the contact pads 14. Another portion 34 of the central contact finger 26 is mechanically wrapped around the solder preform 12 to attach the solder preform to an outer opposite surface of the central contact finger.

The stems 18 and the resilient clamping fingers 24 and 26 of the leads 10 are formed of a base metal such as phosphor bronze, which is not readily wetted by solder when oxidized as a result of exposure to the atmosphere, and which is coated on opposite sides thereof with thin coatings 36 and 38 (magnified in thickness in FIGS. 2 and 3 for purposes of illustration) of metal which is readily wetted by solder, such as tin. The tin coatings 36 and 38, which may be on the order of 0.2–0.5 mils thick, facilitate the subsequent making of electrical solder connections to the leads 10. The stems 18 of the leads 10 also are formed integrally connected to an elongated continuous apertured support rail 40 (FIG. 1) which subsequently is clipped from the stems after the leads 10 have been mounted on the substrate circuit device 16 and soldered to their respective contact pads 14 as shown in FIG. 3. The solder preforms 12 each consist of an essentially cylindrical piece of a relatively malleable solder wire, such as a 60–40 tin-lead alloy.

As a result of the manner in which the solder-bearing leads 10 are fabricated from a tin-coated phosphor bronze strip (not shown) in a progressive punch-and-die as above described, when each lead is mounted on the substrate circuit device 16 the portion of the solder preform 12 held by the central contact finger 26 of the lead is separated from the contact pad 14 with which the central contact finger is engaged, by oxidized phosphor bronze base metal side portions of the contact finger, which are not readily wetted by solder. As a result, solder from the melted preform 12 in a soldering operation normally tends to flow along the solder-wettable tin coating 36 of the lead on the lead stem 18 in a "wicking" action to a narrow portion 42 of the stem, which subsequently must form a soldered connection with a circuit path on a printed circuit board (not shown). In each of the disclosed leads 10 in accordance with this invention, however, the molten solder of the preform 12 is precluded from flowing to the narrow portion 42 of the lead stem 18 by the first solder stop 20, and thus is essentially confined in the vicinity of the central contact finger 26, whereby substantially all of the melted solder flows across the thickness of the finger to the contact pad 14. The molten solder then also is essentially confined in the vicinity of the central contact finger 26 and precluded from flowing away from the contact pad 14 along the tin coating 38 on the stem 18 to the narrow portion 42 of the stem, by the second solder stop 22, and subsequently resolidifies to form a solder connection 44 as illustrated in FIG. 3.

In the embodiment of the invention shown in FIGS. 1, 2 and 3, the first and second solder stops 20 and 22 are formed on enlarged portions of the stems 18 of the leads 10 by removing bands of the tin coatings 34 and 36, respectively, to expose the underlying phosphor bronze metal. The removal of the bands of the tin coatings 34 and 36 may be accomplished, by way of example, by advancing the above-mentioned strip of tin-coated stock (not shown) from which the leads 10 are formed, through a fixed skiving or scraping tool (not shown) prior to forming the leads in the above-mentioned progressive punch and die (not shown). Then, as the exposed portions of the phosphor bronze base metal subsequently oxidize as a result of exposure to the atmosphere, they form the solder stops 20 and 22 which are not readily wetted by solder. This oxidation of the exposed portions of the phosphor bronze base metal may be enhanced by blowing hot air on the exposed metal during the skiving operation, if so desired. In the alternative, the solder stops 20 and 22 may be formed in other manners, such as by electroplating on the phosphor-bronze base metal, applying organic coating material on the base metal, or otherwise forming a solder-nonwettable band on the strip of stock material prior to forming the leads in the progressive punch and die, if so desired.

FIGS. 4, 5 and 6 disclose an alternate embodiment of the invention in which each of a plurality of solder-bearing leads 10' of a known type includes a set of three resilient spring clamping fingers, consisting of two outer fingers 24' and a central contact finger 26', projecting essentially perpendicularly from an enlarged end of a lead stem 18', rather than parallel to the stem as in the embodiment of the invention shown in FIGS. 1, 2 and 3. As in the embodiment of the invention of FIGS. 1, 2 and 3, the central contact finger 26' of each lead 10' is mechanically wrapped around a solder mass or preform 12', and the fingers 24' and 26' define a gap 32' (FIG. 5) for mounting the lead on a substrate circuit device 16' with the central contact finger in firm engagement with a contact pad 14'. The lead stem 18' and the fingers 24' and 26' also are formed from a base metal, such as phosphor bronze, having coatings 36' and 38' of a metal which is readily wetted by solder, such as tin, on the opposite sides thereof.

Further, as in the embodiment of the invention shown in FIGS. 1, 2 and 3, in accordance with this invention the stem 18' of each lead 10' includes solder-confining stops 20' and 22' formed on opposite sides of the base metal by removing portions of the tin coatings 36' and 38', prior to the forming of the lead in a progressive punch and die (not shown) as described hereinabove. As in the embodiment of the invention shown in FIGS. 1, 2 and 3, the solder-confining stops 20' and 22' also are formed on opposite sides of an enlarged portion of the lead stem 18' to preclude flow of molten solder up the stem to a narrow portion 42' of the stem which subsequently must form a soldered connection to a circuit path on a printed wiring board.

In summary, a new and improved solder-bearing lead, such as the lead 10 (FIGS. 1, 2 and 3) or 10' (FIGS. 4, 5 and 6) has been disclosed. With reference to the solder-bearing lead 10, the first and second solder-confining stops 20 and 22 are formed by oxidized portions of the solder-nonwettable base metal of the lead, from which portions of the solder-wettable coatings 36 and 38 have been removed, respectively. The first solder stop 20 essentially precludes flow of molten solder from the solder preform 12 on the resilient spring contact finger 26 along the adjacent side of the stem 18 to the narrow portion 42 of the stem during a soldering operation, whereby substantially all of the molten solder flows across the thickness of the contact finger onto a respective one of the contact pads 14 of the substrate circuit device during the soldering operation, to form the soldered connection 44. During the soldering operation, the second solder stop 22 essentially precludes flow of the molten solder from the contact pad 14 along the opposite side of the stem to the narrow portion 42 of the stem, thus cooperating with the first solder stop 20 in the forming of the soldered connection 44. Further, by precluding flow of the molten solder along the stem 18, the solder stops 20 and 22 prevent the molten solder from contaminating the tin coatings 36 and 38.

Similarly, with reference to the solder-bearing lead 10' (FIGS. 4, 5 and 6), the first solder-confining stop 20' essentially precludes molten solder from the solder preform 12' from flowing up the stem 18' of the lead as a result of a "wicking" action, and then flowing back down the lead, thus contaminating and/or causing thinning of the tin coating 36' on the narrow portion 42' of the stem. Rather, substantially all of the molten solder from the solder preform 12' flows over the sides of the spring contact finger 24' onto the adjacent contact pad 14', on which it then is essentially confined by the second solder stop 22' against flow through a "wicking" action up the opposite side of the stem 18' to the narrow portion 42' of the stem.

What is claimed is:

1. A solder-bearing lead formed essentially from a base metal which tends to oxidize upon exposure to the atmosphere so as to become resistant to solder, which comprises:

an elongated stem which includes at least one surface having the base metal thereof partially coated with a metal coating which is readily wetted by solder for soldering of the stem to an associated article;

first and second resilient clamping fingers extending in opposed spaced relationship from the elongated stem to define a gap for the reception of a substrate therebetween, at least one of the clamping fingers defining an electrical contact finger having an inner surface for engaging a contact pad on the substrate and having an outer opposite surface which defines a continuation of the one surface of the stem and which has the base metal thereof coated with a metal coating which is readily wetted by solder;

a solder preform attached to the metal-coated outer opposite surface of the electrical contact finger; and a solder-confining stop formed on the one surface of the lead stem by an oxidized uncoated portion of the base metal between the solder preform on the electrical contact finger and the metal coating on the stem, for precluding flow of molten solder from the solder preform along the stem to the metal coating thereon during a reflow solder operation in which the electrical contact finger is soldered to the contact pad on the substrate.

2. A solder-bearing lead as recited in claim 1, in which:

the solder-confining stop on the lead stem is defined by an oxidized portion of the base metal from which a portion of the metal coating on the stem has been removed.

3. A solder-bearing lead as recited in claim 1, in which:

the lead stem includes a second opposite surface having the base metal thereof partially coated with a metal coating which is readily wetted by solder for soldering of the stem to the associated article, the inner surface of the electrical contact finger defining a continuation of the second opposite surface of the stem and having the base metal thereof coated with a metal coating which is readily wetted by solder; and a second solder-confining stop is formed on the second opposite surface of the lead stem by another oxidized uncoated portion of the base metal between the inner surface of the electrical contact finger and the metal coating on the second surface, for precluding flow of molten solder along the second surface to the metal coating thereon during the soldering operation in which the electrical contact finger is bonded to the contact pad on the substrate.

4. A soldering-bearing lead as recited in claim 3, in which:

the base metal of the inner and outer surfaces of the resilient clamping finger which defines the electrical contact finger, and of opposite surfaces of the other resilient clamping finger, is coated with the same metal coatings as the surfaces of the lead stem; and each of the solder-confining stops on the lead stem is defined by an oxidized portion of the base metal from which a portion of a respective one of the metal coatings on the stem has been removed.

* * * * *